March 21, 1967 C. B. SWAN 3,310,760

STRIP LINE TUNING STRUCTURES

Filed Aug. 12, 1964 2 Sheets-Sheet 1

INVENTOR
C. B. SWAN
BY
Roderick B. Anderson
ATTORNEY

United States Patent Office 3,310,760

Patented Mar. 21, 1967

3,310,760

STRIP LINE TUNING STRUCTURES

Clarence B. Swan, Warren Township, Somerset County, N.J., assignor to Bell Telephone Laboratories, Incorporated, New York, N.Y., a corporation of New York Filed Aug. 12, 1964, Ser. No. 389,125
4 Claims. (Cl. 333—24)

This relates to tuning devices, and more particularly, to tuning devices for use in strip transmission lines.

Strip transmission lines, or strip lines, are being widely studied and used because of their capacity for efficiently transmitting microwave frequency electromagnetic wave energy. A strip line is defined merely by a pair of spaced flat parallel conductors, one of which is normally maintained at a fixed direct-current potential. The propagating wave energy is defined by high frequency electric fields extending between the two conductors. Strip lines can easily be fabricated by known printed circuit techniques by forming the flat conductors on dielectric spacers which separate them. For this and other reasons, strip line circuits are often simpler and more flexible than circuits using coaxial cables or waveguides for propagating high frequency wave energy, although strip lines may disadvantageously radiate more wave energy than the latter devices. Such radiation can be minimized by using balanced strip line structures which comprise two fixed potential or ground conductors on opposite sides of the active conductor. In this version the wave energy is defined by fields extending from the active conductor to both ground conductors.

As is true in most electronic circuits, printed strip lines frequently require tuning devices for adjusting their reactances. These adjustments are required, for example, for impedance matching purposes and for adjusting the rejection frequencies or pass frequencies of filters. The conventional tuning device is a conductive screw that extends from the ground conductor to a point adjacent the active conductor. The screw establishes a shunt capacitance between the active and ground conductors which can be adjusted by threading the screw toward or away from the active conductor.

A screw of this type inherently introduces losses which at high frequencies are not readily predictable and which may vary substantially under conditions of mechanical stress. This is due partly to the fact that the screw cannot normally be supported by the thin ground conductor so that induced currents may flow from the screw to the ground conductor along paths of unpredictable length, thereby creating spurious impedances. Further, a tuning screw of this type can be used only for varying the shunt capacitance of the active conductor, while a variable series capacitance in the active conductor would in many cases give more responsive tuning.

In accordance with one embodiment of my invention, a small gap separates two portions of the flat active conductor of the printed strip line. The series capacitance across this gap is varied by a rotatable flat tuning conductor which overlaps the two active conductor portions and which is insulated from the active conductors and the ground conductors. The tuning conductor is preferably mounted eccentrically on a rotatable dielectric shaft that extends through the ground conductor. When the shaft is rotated, the proportion of the tuning conductor that overlaps each of the two active conductor portions is varied. Since the capacitive coupling between the rotatable tuning conductor and each of the active conductor portions is proportional to the area of overlap, rotation of the dielectric shaft varies the capacitive coupling between the two active conductor portions. Hence, the strip line is effectively tuned through adjustment of the series capacitance of the active conductor.

This type of tuner is particularly useful in strip lines because it introduces practically no spurious losses even at very high frequencies. This is because the rotatable shaft is made of dielectric material and no electrical contact is made with the ground conductor. After the tuning conductor is properly oriented, the dielectric shaft can be clamped to prohibit further rotation as will be described later. Even when the strip line is subjected to rigorous mechanical stresses, the tuning will not change, because any such change inherently requires rotation of the tuning conductor.

In a preferred embodiment, two approximately semicircular tuning plates are used which are both attached to a single dielectric shaft, the two tuning plates being insulated from each other. When the shaft is rotated to one position, each of the tuning plates overlaps only one of the active conductor portions. In this position the tuning plates contribute very little capacitive coupling between the active conductor portions and the series capacitance is at a minimum. When the shaft is rotated ninety degrees, both of the tuning plates overlap each of the active conductor portions equally. In this position the capacitive coupling and the series capacitance between the active conductor portions is at a maximum. I have found that this embodiment gives accurate capacitive tuning over a very wide range. A single semicircular tuning plate can, of course, also be used, but this does not give as wide a range of tuning.

I have found that my rotatable tuning plate can also be used advantageously to alter the rejection frequency of an open circuited strip line stub. A strip line stub is merely a short projection from the active conductor which operates as a frequency filter because the open circuit at the end of the projection is reflected at the main transmission path as either a low impedance or a high impedance, depending on the frequency of the propagating wave. In accordance with this aspect of the invention, an eccentrically mounted rotatable tuning plate is located at the end of the stub. In one position the tuning plate completely overlaps the active conductor stub portion and has no effect on the rejection frequency. As the dielectric shaft to which it is attached is rotated, the tuning plate protrudes over the end of the tuning stub. The stub portion induces currents in the tuning plate so that the tuning plate essentially acts as part of the stub portion. Consequently, when the tuning plate is projected over the end of the stub portion, it effectively increases the length of the stub and thereby alters its rejection frequency. The tuning plate therefore tunes the frequency of the strip line stub but as explained previously, does not introduce spurious losses.

These and other features of my invention will be more fully appreciated from a consideration of the following detailed description taken in conjunction with the accompanying drawing in which.

Figure 1:
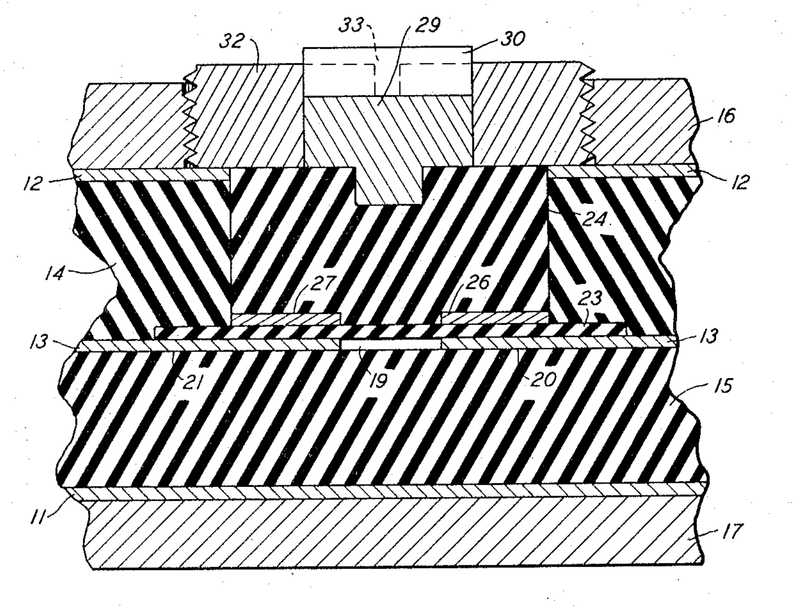
FIG. 1 is a sectional view of one embodiment of the invention.
Figure 2:
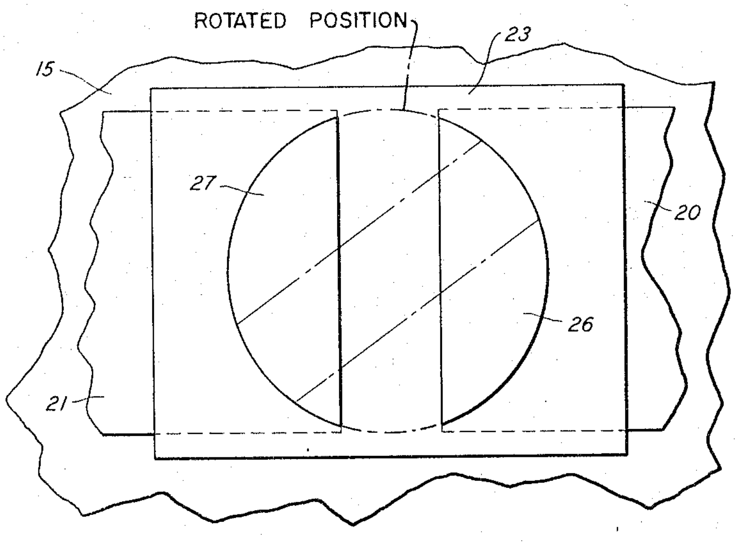
FIG. 2 is a top view of the tuning plates of FIG. 1.

Referring now to FIGS. 1 and 2 there is shown a printed balanced strip line comprising first and second flat ground conductors 11 and 12. A flat active conductor 13 is located between the ground conductors and is separated from them by dielectric slabs 14 and 15. In balanced strip lines, propagating electromagnetic waves are defined by electric fields extending from the active conductor to both of the parallel ground conductors. The ground and active conductors are typically made of very thin conductive material such as copper. Thick metal plates 16 and 17 are bolted to the ground conductors to give the strip line strength and rigidity. The thin active and ground conductors can advantageously be fabricated by known printed circuit techniques.

A gap 19 in the active conductor 13 separates the active conductor into two portions 20 and 21 and establishes a series capacitance therebetween. In accordance with the invention, a rotatable dielectric shaft 24 extends through the ground conductor 12 toward the gap 19. Bonded to the bottom of the shaft are two conductive tuning plates 26 and 27, which are insulated from each other and from the active conductor by a dielectric spacer 23.

As can be seen in FIG. 2, each of the tuning plates is approximately semicircular in shape. With the rotatable dielectric shaft in the position shown on the drawing, tuning plate 27 completely overlaps active conductor portion 21 while tuning plate 26 completely overlaps active conductor portion 20.

The dielectric shaft 24 is rotated by a conductive rotating mechanism 29 which is keyed to the dielectric shaft. A slot 30 in the rotating mechanism permits it to be easily rotated by means of a screwdriver. When the rotating mechanism 29 and dielectric shaft 24 are turned, the tuning plates 26 and 27 rotate to vary the capacitance across gap 19 in a manner to be described later. One rotated position of the plates is shown in phantom for purposes of comparison. A threaded collar 32 having a slot 33 surrounds the rotating mechanism 29. When the tuning plates 26 and 27 have been rotated to a desired angular position, the collar 32 is tightened by inserting the screwdriver into slot 33 to lock the dielectric shaft 24 firmly in position. In one constructed operative form, the dielectric slabs were 62 mils thick, the active conductor 13 was 3 mils thick and 80 mils wide, the dielectric plate 23 was made of mica and was 3 mils thick, gap 19 was 20 mils, and the diameter of rotatable dielectric shaft 24 was 80 mils.

Figure 3:
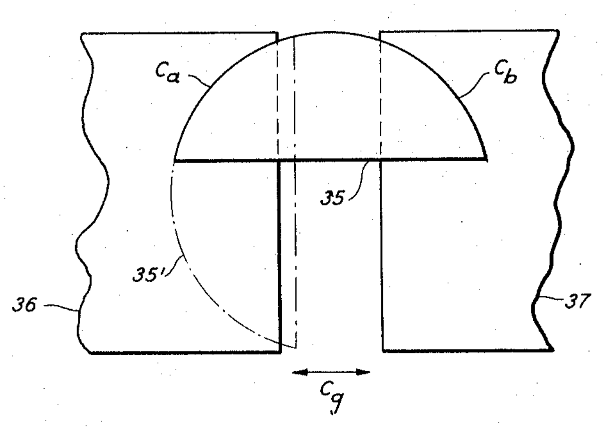
FIG. 3 is a perspective schematic view of another embodiment of the invention.
Figure 4:
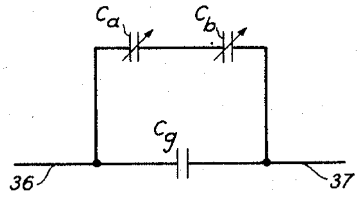
FIG. 4 is a schematic diagram of the device of FIG. 3.

The strip line tuner could alternatively comprise a single tuning plate 35 as shown in FIG. 3. This tuning plate is capable of overlapping two active conductor portions 36 and 37 in the same manner as in FIG. 1. The equivalent circuit of this device is shown in FIG. 4 wherein $C_g$ represents the capacitance across the gap separating conductor portions 36 and 37, $C_a$ is the capacitance between tuning plate 35 and conductor portion 36, and $C_b$ is the capacitance between the tuning plate and conductor portion 37. It can be seen that the total capacitance $C_t$ between conductor portions 36 and 37 is $$C_t = C_g + C_{(a+b)} \qquad (1)$$

where $$C_{(a+b)} = \frac{C_a C_b}{C_a + C_b} \qquad (2)$$

Neglecting fringing fields, capacitances $C_a$ and $C_b$ are given by:

$$C_a = \frac{\epsilon A_a}{d} \qquad (3)$$

$$Cb = \frac{\epsilon A_b}{d} \qquad (4)$$

where $\epsilon$ is the dielectric constant between the tuning plate and the active conductor portions, $d$ is the distance between the tuning plate and the active conductor portions which it overlaps, $A_a$ is the area of conductor portion 36 which is overlapped by the tuning plate 35, and $A_b$ is the area of conductor portion 37 which is overlapped by the tuning plate.

In the position shown in FIG. 3 a substantial area of both active conductor portions is overlapped by the tuning plate. This gives substantial capacitances $C_a$ and $C_b$ by Equations 3 and 4, a substantial capacitance $C_{(a+b)}$ by Equation 2, and therefore a maximum series capacitance $C_t$ by Equation 1. If, on the other hand, tuning plate 35 were rotated 90 degrees to the position 35′ shown in phantom, and we neglect small fringing capacitances, the quantity $C_b$ would be equal to zero by Equation 4 because it does not overlap any of active conductor portion 37. Hence, the product of $C_a$ and $C_b$ would be zero and the net series capacitance $C_g$ by Equation 1 would be equal to only the gap capacitance $C_g$. The position 35′ therefore represents a minimum series capacitance position of the tuning plate. It can be appreciated that as the tuning plate is rotated, the net series capacitance $C_t$ is substantially varied.

The preferred device of FIG. 1 operates according to the same principles as those of FIGS. 3 and 4. The two tuning plates 26 and 27, however, give twice the variation in series capacitance as the single tuning plate of FIG. 3. The circular shapes of the tuning plates of FIGS. 1 through 3 are advantageous for giving a gradual change of capacitive coupling as they are rotated. However, various other shapes could alternatively be used. The tuning plate should be capable of overlapping both active conductor segments simultaneously. Further, the area of such overlap should vary as the tuning plate is rotated. This is preferably accomplished by mounting the tuning plate eccentrically or asymmetrically with respect to the axis of rotation of the shaft, although a symmetrically rotatable plate could be used if it were of an irregular shape.

The tuning plates described are particularly advantageous at high frequencies because they are of such simple structure and do not require firm mechanical contacts for establishing predictable electrical paths. Hence, even if they are subjected to mechanical stresses they will not introduce spurious impedances unless they are actually rotated. Further, as can be seen in FIG. 1, the tuning device does not interfere with the uniform propagation of wave energy because the conductive rotating mechanism 29 constitutes part of the ground conductor; the dielectric shaft is preferably made of the same material as dielectric slab 14 so that it does not constitute a discontinuity.

Figure 5:
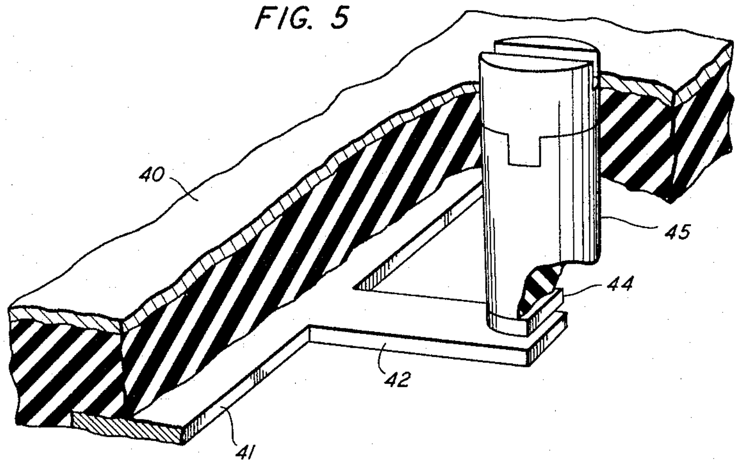
FIG. 5 is a perspective view of another embodiment of the invention.

Referring now to FIG. 5, there is shown a strip line comprising a ground conductor 40 and an active conductor 41. Extending from the active conductor is a tuning stub 42 for tuning out certain frequencies of propagation along the strip line. The end of stub 42 constitutes an open circuit. The impedance of this open circuit which is reflected back to the transmission path depends on the frequency of the wave under consideration; it therefore tunes out certain frequencies, as is well known in the art. The frequencies which stub 42 rejects or passes depend upon the electrical length of the stub. The open circuit will be reflected back to the transmission path as a short circuit only if the stub is an integral number of quarter wavelengths at the particular frequency under consideration.

In accordance with the invention, a semicircular tuning plate 44 overlaps the end of tuning stub 42. Tuning plate 44 is bonded to an end surface of a rotatable dielectric shaft 45. Currents in stub 42 induce currents in tuning plate 44 so that plate 44 effectively acts as part of the tuning stub.

Rotation of shaft 45 causes tuning plate 44 to protrude out from the end of stub 42. Because of the induced currents in plate 44, this protrusion effectively extends the length of stub 42 and therefore alters its rejection frequency. After plate 44 has been rotated to a desired position, it may be locked in position by a device such as that shown in FIG. 1 or by any other suitable locking device.

It should be pointed out that in the tuning devices of FIGS. 1 through 3 the tuning plate must be insulated from the active conductor portions to give variable capacitive coupling. In the device of FIG. 5 the tuning plate could be in contact with the active conductor stub portion 42.

and still operate to vary its effective electrical length. It is preferred, however, that tuning plate 44 of FIG. 5 also be insulated from stub 42 either by a small air gap as shown or by a thin dielectric spacer because mechanical contacts are susceptible to mechanical stresses and to electrical path irregularities, as pointed out previously. In all the embodiments shown, the tuning plates should be in close proximity to the corresponding active conductors for strong coupling.

The tuning devices which have been described are intended to be illustrative of preferred embodiments of the invention. Various other arrangements may be made by those skilled in the art without departing from the spirit and scope of the invention.

What is claimed is:

1. In combination:

a strip transmission line comprising a flat ground conductor and a flat active conductor;

a gap separating first and second portions of the active conductor;

means for varying the series capacitance between the first and second portions of the active conductor comprising a rotatable irregularly shaped flat conductor adjacent the gap and insulated from the ground conductor and both portions of the active conductor;

the rotatable flat conductor being capable of overlapping the first and second portions simultaneously.

2. The combination of claim 1 wherein:

the rotatable flat conductor is substantially semicircular in shape;

and further comprising a rotatable dielectric shaft which extends between the ground conductor and the gap;

said rotatable flat conductor being attached to one end of said dielectric shaft.

3. The combination of claim 1 wherein:

the rotatable flat conductor is capable of overlapping only the first portion without partially overlapping the gap, and being rotatable to a position at which it overlaps the first and second portions substantially equally.

4. In combination:

a strip transmission line comprising a flat ground conductor separated from a flat active conductor by a dielectric slab;

a gap separating two portions of the active conductor;

a cylindrical dielectric shaft extending through the dielectric slab between the ground conductor and the gap;

the shaft and the slab being made of the same material;

a first end of said shaft overlapping both portions of the active conductor;

an aperture in the ground conductor;

a cylindrical rotating mechanism contained within said aperture and attached to said dielectric shaft;

said rotating mechanism being made of conductive material having a bottom surface the major portion of which is flush with a corresponding bottom surface of the ground conductor, whereby a substantially continuous conductive plate is formed by the ground conductor and the rotating mechanism;

two approximately semicircular conductive tuning plates mounted on the surface of the first end of the dielectric shaft on opposite sides of the central axis of the dielectric shaft;

said tuning plates being insulated from each other and from the active conductor;

and means for rotating the conductive rotating mechanism and the dielectric shaft.

References Cited by the Examiner

UNITED STATES PATENTS

| | | | |
|---|---|---|---|
| 2,892,163 | 6/1959 | Todd | 333—73 |
| 2,925,568 | 2/1960 | Baldwin | 333—84 X |
| 3,114,121 | 12/1963 | Jordan | 333—84 |
| 3,117,379 | 1/1964 | Ayer | 333—73 |
| 3,210,697 | 10/1965 | Comstock | 333—81 |

References Cited by the Applicant

UNITED STATES PATENTS

| | | |
|---|---|---|
| 1,641,438 | 9/1927 | Jones. |
| 1,938,334 | 12/1933 | Hoffman. |

HERMAN KARL SAALBACH, *Primary Examiner.*

M. NUSSBAUM, *Assistant Examiner.*